US009508628B2

(12) United States Patent
Kirby et al.

(10) Patent No.: US 9,508,628 B2
(45) Date of Patent: Nov. 29, 2016

(54) SEMICONDUCTOR SUBSTRATES WITH UNITARY VIAS AND VIA TERMINALS, AND ASSOCIATED SYSTEMS AND METHODS

(71) Applicant: Micron Technology, Inc., Boise, ID (US)

(72) Inventors: Kyle K. Kirby, Eagle, ID (US); Kunal R. Parekh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 68 days.

(21) Appl. No.: 14/154,329

(22) Filed: Jan. 14, 2014

(65) Prior Publication Data

US 2014/0252562 A1     Sep. 11, 2014

Related U.S. Application Data

(60) Continuation of application No. 13/241,059, filed on Sep. 22, 2011, now Pat. No. 8,629,057, which is a division of application No. 12/253,121, filed on Oct. 16, 2008, now Pat. No. 8,030,780.

(51) Int. Cl.
*H01L 23/04* (2006.01)
*H01L 23/52* (2006.01)
(Continued)

(52) U.S. Cl.
CPC ....... *H01L 23/481* (2013.01); *H01L 21/76898* (2013.01); *H01L 24/11* (2013.01);
(Continued)

(58) Field of Classification Search
CPC ................ H01L 23/5226; H01L 2924/01078; H01L 2924/01079; H01L 23/481; H01L 23/49827; H01L 2225/06541; H01L 2225/06544; H01L 2225/06548
USPC .................. 257/E21.499, E21.585, E23.068, 257/E25.017, 200, 621, 622, 667, 680, 698, 257/774, 775, E23.067, E23.174; 174/255; 438/107, 613, 629, 637, 639, 640, 667, 438/668, 672, 675, 700, 701, 713, 638, 978
See application file for complete search history.

(56) References Cited

U.S. PATENT DOCUMENTS 5,646,057 A    7/1997 Liu et al.
5,682,062 A   10/1997 Gaul
(Continued)

FOREIGN PATENT DOCUMENTS

CN    1453847 A    11/2003
EP    1415950 A2    5/2004
(Continued)

OTHER PUBLICATIONS

De Boer, M.J. et al., "Micromachining of Buried Micro Channels in Silicon," Journal of Microelectromechanical Systems, vol. 9, No. 1, Mar. 2000, IEEE, ISSN: 1057-7157.
(Continued)

*Primary Examiner* — Matthew E Warren
(74) *Attorney, Agent, or Firm* — Perkins Coie LLP

(57) ABSTRACT

Semiconductor substrates with unitary vias and via terminals, and associated systems and methods are disclosed. A representative method in accordance with a particular embodiment includes forming a blind via in a semiconductor substrate, applying a protective layer to a sidewall surface of the via, and forming a terminal opening by selectively removing substrate material from an end surface of the via, while protecting from removal substrate material against which the protective coating is applied. The method can further include disposing a conductive material in both the via and the terminal opening to form an electrically conductive terminal that is unitary with conductive material in the via. Substrate material adjacent to the terminal can then be removed to expose the terminal, which can then be connected to a conductive structure external to the substrate.

8 Claims, 11 Drawing Sheets

(51) Int. Cl.
*H01L 29/40* (2006.01)
*H01L 23/48* (2006.01)
*H01L 21/768* (2006.01)
*H01L 23/00* (2006.01)
*H01L 25/065* (2006.01)

(52) U.S. Cl.
CPC .......... *H01L25/0657* (2013.01); *H01L 24/16* (2013.01); *H01L 2224/05568* (2013.01); *H01L 2224/05573* (2013.01); *H01L 2224/13009* (2013.01); *H01L 2224/13025* (2013.01); *H01L 2224/13099* (2013.01); *H01L 2225/06544* (2013.01); *H01L 2225/06548* (2013.01); *H01L 2924/00014* (2013.01); *H01L 2924/014* (2013.01); *H01L 2924/01006* (2013.01); *H01L 2924/01013* (2013.01); *H01L 2924/01023* (2013.01); *H01L 2924/01029* (2013.01); *H01L 2924/01033* (2013.01); *H01L 2924/01047* (2013.01); *H01L 2924/01049* (2013.01); *H01L 2924/01073* (2013.01); *H01L 2924/01074* (2013.01); *H01L 2924/01075* (2013.01); *H01L 2924/01079* (2013.01); *H01L 2924/12042* (2013.01); *H01L 2924/14* (2013.01)

(56) References Cited

U.S. PATENT DOCUMENTS

| | | | |
|---|---|---|---|
| 5,786,238 | A | 7/1998 | Pai et al. |
| 5,870,823 | A | 2/1999 | Bezama et al. |
| 5,998,240 | A | 12/1999 | Hamilton et al. |
| 6,114,240 | A | 9/2000 | Akram et al. |
| 6,235,554 | B1 | 5/2001 | Akram et al. |
| 6,400,172 | B1* | 6/2002 | Akram ............... H01L 21/486 257/E21.511 |
| 6,457,515 | B1 | 10/2002 | Vafai et al. |
| 6,472,293 | B1 | 10/2002 | Suga |
| 6,521,516 | B2 | 2/2003 | Monzon et al. |
| 6,582,987 | B2 | 6/2003 | Jun et al. |
| 6,599,436 | B1 | 7/2003 | Matzke et al. |
| 6,606,251 | B1 | 8/2003 | Kenny, Jr. et al. |
| 6,608,371 | B2 | 8/2003 | Kurashima et al. |
| 6,699,787 | B2 | 3/2004 | Mashino et al. |
| 6,768,205 | B2 | 7/2004 | Taniguchi et al. |
| 6,825,557 | B2 | 11/2004 | DiBattista et al. |
| 6,828,175 | B2 | 12/2004 | Wood et al. |
| 6,873,054 | B2* | 3/2005 | Miyazawa ............... H01L 23/48 257/774 |
| 6,946,325 | B2 | 9/2005 | Yean et al. |
| 7,083,425 | B2 | 8/2006 | Chong et al. |
| 7,109,068 | B2 | 9/2006 | Akram et al. |
| 7,262,495 | B2 | 8/2007 | Chen et al. |
| 7,271,086 | B2 | 9/2007 | Tang et al. |
| 7,317,256 | B2 | 1/2008 | Williams et al. |
| 7,358,602 | B2 | 4/2008 | Hara |
| 7,425,499 | B2 | 9/2008 | Oliver et al. |
| 7,485,969 | B2 | 2/2009 | Corisis et al. |
| 7,514,298 | B2 | 4/2009 | Tanaka et al. |
| 7,524,753 | B2 | 4/2009 | Sunohara et al. |
| 7,553,699 | B2 | 6/2009 | Lee |
| 7,602,047 | B2 | 10/2009 | Kwon et al. |
| 7,732,925 | B2 | 6/2010 | Okayama et al. |
| 7,759,800 | B2 | 7/2010 | Rigg et al. |
| 7,786,008 | B2 | 8/2010 | Do et al. |
| 2001/0007373 | A1* | 7/2001 | Kadota ............... H01L 23/4985 257/730 |
| 2002/0017710 | A1 | 2/2002 | Kurashima et al. |
| 2002/0190371 | A1 | 12/2002 | Mashino et al. |
| 2003/0045085 | A1 | 3/2003 | Taniguchi et al. |
| 2003/0119279 | A1 | 6/2003 | Enquist |
| 2003/0119308 | A1 | 6/2003 | Geefay et al. |
| 2004/0016942 | A1 | 1/2004 | Miyazawa et al. |
| 2004/0048459 | A1 | 3/2004 | Patti |
| 2004/0061238 | A1 | 4/2004 | Sekine |
| 2004/0141536 | A1 | 7/2004 | Liu et al. |
| 2004/0214373 | A1 | 10/2004 | Jiang et al. |
| 2004/0219765 | A1 | 11/2004 | Reif et al. |
| 2004/0245623 | A1 | 12/2004 | Hara et al. |
| 2005/0017333 | A1 | 1/2005 | Bohr |
| 2005/0046002 | A1 | 3/2005 | Lee et al. |
| 2005/0067620 | A1 | 3/2005 | Chan et al. |
| 2005/0136634 | A1 | 6/2005 | Savastiouk et al. |
| 2005/0140921 | A1 | 6/2005 | Lee et al. |
| 2005/0275048 | A1 | 12/2005 | Farnworth et al. |
| 2006/0003566 | A1 | 1/2006 | Emesh |
| 2006/0043599 | A1 | 3/2006 | Akram et al. |
| 2006/0046468 | A1* | 3/2006 | Akram ............... H01L 21/76898 438/637 |
| 2006/0223301 | A1 | 10/2006 | Vanhaelemeersch et al. |
| 2006/0252254 | A1 | 11/2006 | Basol |
| 2006/0278979 | A1 | 12/2006 | Rangel |
| 2006/0289967 | A1 | 12/2006 | Heck et al. |
| 2006/0289968 | A1 | 12/2006 | Sulfridge |
| 2006/0290001 | A1 | 12/2006 | Sulfridge |
| 2006/0292877 | A1 | 12/2006 | Lake |
| 2007/0007639 | A1 | 1/2007 | Fukazawa |
| 2007/0020805 | A1 | 1/2007 | Kim et al. |
| 2007/0085189 | A1 | 4/2007 | Sunohara et al. |
| 2007/0111386 | A1 | 5/2007 | Kim et al. |
| 2007/0222050 | A1 | 9/2007 | Lee et al. |
| 2007/0267138 | A1 | 11/2007 | White et al. |
| 2007/0293040 | A1 | 12/2007 | Emesh et al. |
| 2008/0006850 | A1 | 1/2008 | Ribnicek et al. |
| 2008/0050904 | A1 | 2/2008 | Lake |
| 2008/0057620 | A1 | 3/2008 | Pratt |
| 2008/0079120 | A1 | 4/2008 | Foster et al. |
| 2008/0079121 | A1 | 4/2008 | Han |
| 2008/0081386 | A1 | 4/2008 | Raravikar et al. |
| 2008/0081398 | A1 | 4/2008 | Lee et al. |
| 2008/0237881 | A1 | 10/2008 | Dambrauskas et al. |
| 2009/0305502 | A1 | 12/2009 | Lee et al. |
| 2012/0009776 | A1 | 1/2012 | Kirby et al. |

FOREIGN PATENT DOCUMENTS

| | | |
|---|---|---|
| JP | 2003503855 A | 1/2003 |
| JP | 2003078080 A | 3/2003 |
| JP | 2003318178 A | 11/2003 |
| JP | 2004128063 A | 4/2004 |
| JP | 2004297019 A | 10/2004 |
| JP | 2005093486 A | 4/2005 |
| JP | 2007053149 A | 3/2007 |
| JP | 2007059796 A | 3/2007 |
| JP | 2007115776 A | 5/2007 |
| KR | 100733467 B1 | 6/2007 |
| WO | 03065450 A2 | 8/2003 |
| WO | 2004109770 A2 | 12/2004 |

OTHER PUBLICATIONS

International Search Report and Written Opinion issued Feb. 25, 2010 in International Application No. PCT/US2009/060434.

Jang, D.M. et al., "Development and Evaluation of 3-D SiP with Vertically Interconnected Through Silicon Vias (TSV)," Proceedings of the 57th Electronic Components and Technology Conference, IEEE, May 29, 2007-Jun. 1, 2007, pp. 847-852, ISBN: 1-4244-0985-3.

Kim, J.Y. et al., "S-RCAT (Sphere-shaped-Recess-Channel-Array Transistor) Technology for 70nm DRAM Feature Size and Beyond," 2005 Symposium on VLSI Technology, Digest of Technical Papers, Jun. 14-16, 2005, pp. 34-35, IEEE, ISBN: 4-900784-02-8.

Morrow, P.R. et al., "Three-Dimensional Wafer Stacking via Cu—Cu Bonding Integrated With 65-nm Strained-Si/Low-k CMOS Technology," IEEE Electron Device Letters, vol. 27, No. 5, pp. 335-337, May 2006, ISBN: 0741-3106.

Office Action issued Feb. 26, 2013 in Taiwan Application No. 098135151, 9 pages.

(56) References Cited

OTHER PUBLICATIONS

Office Action issued Jun. 26, 2012 in Korean Application No. 10-2011-7011066, 18 pages.
Office Action issued Mar. 4, 2013 in China Application No. 200980140926.8, 29 pages.
Office Action issued Mar. 5, 2013 in Japan, Application No. 2011-532174, 7 pages.
Takahashi, K. et al., "Through Silicon via and 3-D Wafer/Chip Stacking Technology," 2006 Symposium on VLSI Circuits, Digest of Technical Papers, pp. 89-92, IEEE, ISBN: 1-4244-006-6.

\* cited by examiner

SEMICONDUCTOR SUBSTRATES WITH UNITARY VIAS AND VIA TERMINALS, AND ASSOCIATED SYSTEMS AND METHODS

CROSS-REFERENCE TO RELATED APPLICATIONS

This application is a continuation of U.S. application Ser. No. 13/241,059 filed Sep. 22, 2011, now U.S. Pat. No. 8,629,057, which is a divisional of U.S. application Ser. No. 12/253,121 filed Oct. 16, 2008, now U.S. Pat. No. 8,030,780, each of which is incorporated herein by reference in its entirety.

TECHNICAL FIELD

The present disclosure is directed generally to semiconductor substrates with unitary vias and via terminals, and associated systems and methods.

BACKGROUND

Packaged semiconductor dies, including memory chips, microprocessor chips, and imager chips, typically include a semiconductor die mounted to a substrate and encased in a plastic protective covering. The die includes functional features, such as memory cells, processor circuits, imager devices, and interconnecting circuitry. The die also typically includes bond pads electrically coupled to the functional features. The bond pads are electrically connected to pins or other types of terminals that extend outside the protective covering for connecting the die to busses, circuits, and/or other microelectronic assemblies.

Market pressures continually drive manufacturers to reduce the size of semiconductor die packages and to increase the functional capacity of such packages. One approach for achieving these results is to stack multiple semiconductor dies in a single package. The dies in such a package are typically interconnected by electrically coupling the bond pads of one die in the package with bond pads of other die(s) in the package.

A variety of approaches have been used to electrically interconnect the dies within a multi-die package. One existing approach is to use solder balls connected directly between the bond pads of neighboring dies. Another approach is to fuse "bumps" on the bond pads of neighboring dies. However, the foregoing processes can suffer from several drawbacks. For example, the foregoing structures typically require a multitude of steps to form the vias, the conductive material in the vias, and the bond pads or other connecting structures that form the connections between stacked dies. Each of the steps takes time and accordingly adds to the cost of manufacturing the packaged device. In addition, in at least some cases, each of the processes can elevate the temperature of the die, which can consume a significant portion of the total thermal budget allotted to the package for processing. As a result, there remains a need for improved techniques for interconnecting dies within a semiconductor package.

DETAILED DESCRIPTION

Several embodiments of the present disclosure are described below with reference to packaged semiconductor devices and assemblies, and methods for forming packaged semiconductor devices and assemblies. Many details of certain embodiments are described below with reference to semiconductor dies. The term "semiconductor die" is used throughout to include a variety of articles of manufacture, including, for example, individual integrated circuit dies, imager dies, sensor dies, and/or dies having other semiconductor features. Several of the processes described below may be used to connect an individual die to another individual die, or to connect an individual die to a wafer or portion of a wafer, or to bond a wafer or portion of a wafer to another wafer or portion of a wafer. The wafer or wafer portion (e.g., wafer form) can include an unsingulated wafer or wafer portion, or a repopulated carrier wafer. The repopulated carrier wafer can include an adhesive material (e.g., a flexible adhesive) surrounded by a generally rigid frame having a perimeter shape comparable to that of an unsingulated wafer, with singulated elements (e.g., dies) carried by the adhesive. The term "semiconductor substrate" is used throughout to include the foregoing articles of manufacture in any of the foregoing configurations.

Many specific details of certain embodiments are set forth in FIGS. 1-5 and the following text to provide a thorough understanding of these embodiments. Several other embodiments can have configurations, components, and/or processes different than those described in this disclosure. A person skilled in the relevant art, therefore, will appreciate that additional embodiments may be practiced without several of the details and/or features of the embodiments shown in FIGS. 1-5, and/or with additional details and/or features.

Figure 1:
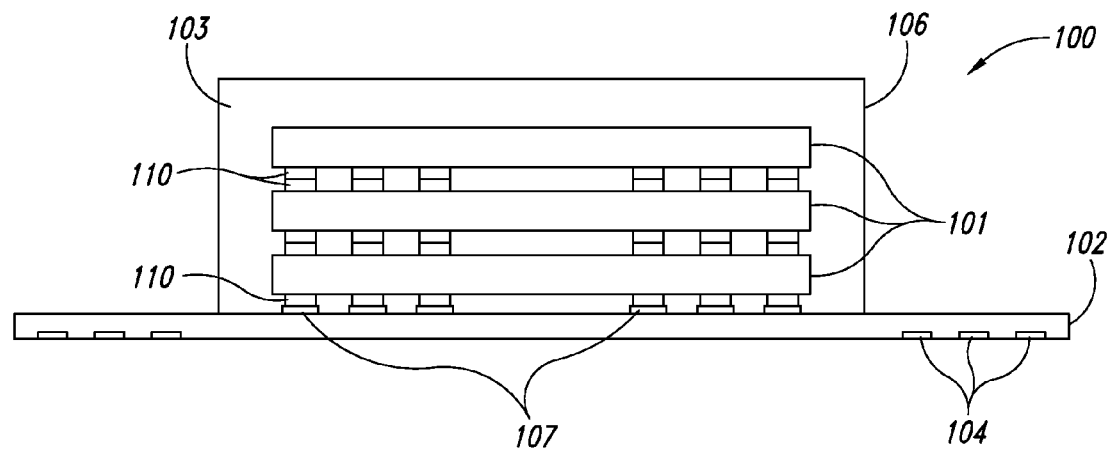
FIG. 1 is a partially schematic, side cross-sectional view of a package configured in accordance with an embodiment of the disclosure.

FIG. 1 is a partially schematic, side cross-sectional view of a semiconductor assembly 100 that includes a semiconductor package 106 configured in accordance with an embodiment of the disclosure. The package 106 can include a support member 102 that carries multiple semiconductor substrates (e.g., semiconductor dies 101) that are interconnected electrically and mechanically with each other. Accordingly, each of the semiconductor dies 101 can include die terminals 110 that are connected to corresponding die terminals 110 of the neighboring die 101. The support member 102 can include support member terminals 107 that are connected to the die terminals 110 of one or more of the semiconductor dies 101. The support member terminals 107 are connected via lines internal to the support member 102 to package terminals 104. The entire package 106 (or portions of the package 106) can be surrounded by an encapsulant 103 to protect the semiconductor dies 101 and the associated connections between the dies 101, while the package terminals 104 remain exposed for connecting the package 106 to external devices, such as printed circuit boards and/or other circuit elements. The following discussion describes additional features of the terminals 110 used to connect neighboring dies 101 to each other, and associated methods for forming such terminals.

Figure 2A:
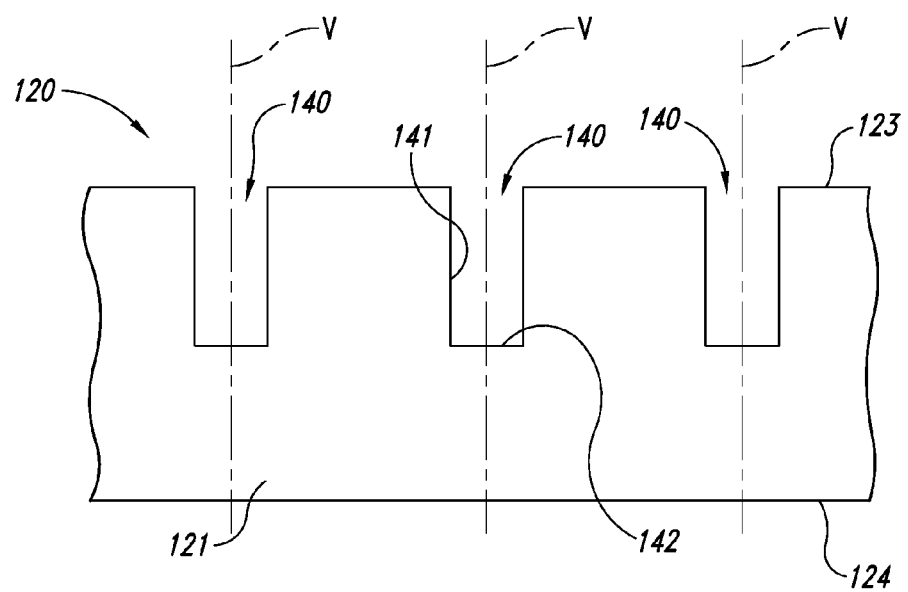
FIGS. 2A-2I are partially schematic, side cross-sectional views of semiconductor substrates undergoing processing in accordance with an embodiment of the disclosure.

FIG. 2A is a partially schematic, side cross-sectional illustration of a semiconductor substrate 120 (e.g., a wafer, wafer portion, die, or other substrate) that includes a substrate material 121 having a first major surface 123 and an oppositely-facing second major surface 124. As shown in FIG. 2A, multiple vias 140 have been formed so as to extend into the first surface 123 along corresponding via axes V. A bond pad can be added to the semiconductor substrate 120 after the vias 140 are formed (as described later with reference to FIG. 2J), or the vias 140 can penetrate through pre-formed bond pads at the first surface 123. Individual vias 140 can be axisymmetric with respect to the corresponding via axis V (e.g., each via 140 can have a circular cross-sectional shape), or the vias 140 can have other cross-sectional shapes that closely surround the via axis V (e.g., a low aspect ratio elliptical shape). The vias 140 can be formed using techniques such as aniosotropic etching techniques. Each via 140 can include one or more sidewall surfaces 141 and an end surface 142. In some embodiments, the sidewall surfaces 141 can be scalloped, e.g., by using as stepwise Bosch etching process. In such cases, the vias 140 can be post-processed (e.g., using $SF_6$ or another isotropic etchant) to smooth the scallops. However, in particular embodiments, the etching process used to form the vias 140 can be a generally continuous process that produces generally smooth, unscalloped sidewall surfaces 141. The sidewall surfaces 141 can accordingly have a generally smooth, cylindrical shape. Suitable processes for forming the via 140 include a wet etch process, a steady state dry etch process, laser drilling, micro-electrodischarge machining, microbead blasting, and others.

The vias 140 are used to house conductive structures that are connected to semiconductor features (not shown in FIG. 2A) within the substrate material 121, and terminals used to electrically connect the semiconductor substrate 120 to other semiconductor substrates and/or support members. The following Figures describe further details of the formation of these terminals.

Figure 2B:
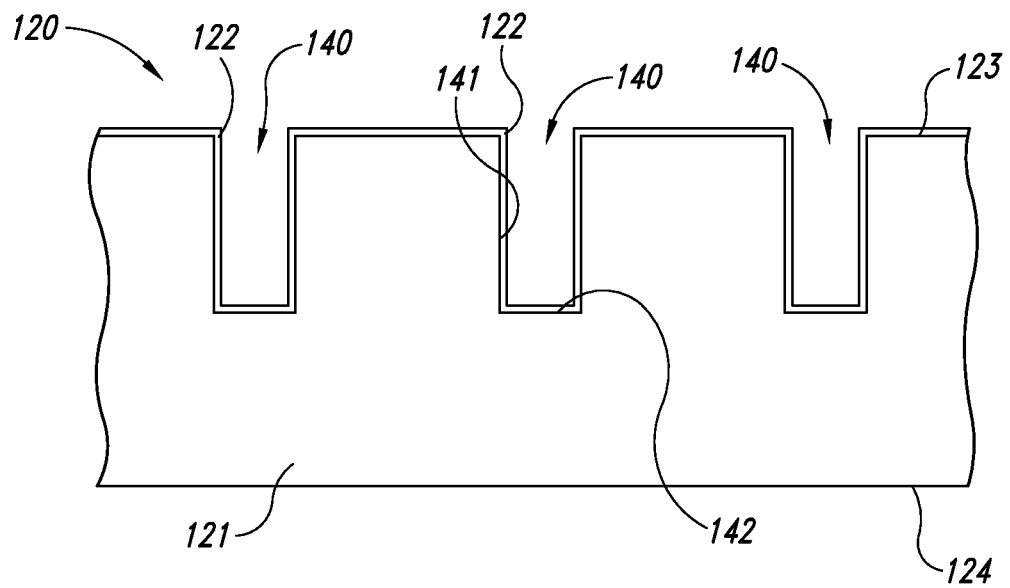
Figure 2C:
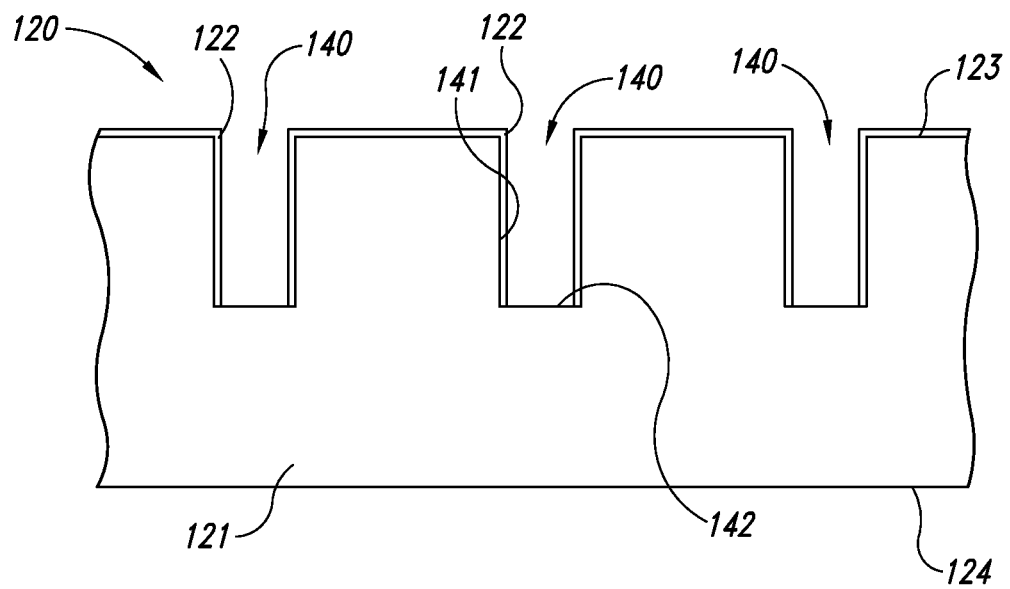

As shown in FIG. 2B, a protective layer 122 has been disposed on the semiconductor substrate 120 so as to cover the sidewall surfaces 141 and end surfaces 142 of the vias 140. The protective layer 122 can include a $C_4F_8$ passivation layer, CVD-deposited oxides or nitrides, or other suitable materials. In FIG. 2C, the portions of the protective layer 122 covering the end surfaces 142 of the individual vias 140 have been removed, so as to re-expose the end surfaces 142. The portions of the protective layer 122 over the end surfaces 142 can be selectively removed, e.g., without removing the portions of the protective layer 122 adjacent to the sidewall surfaces 141. For example, an anisotropic removal process can be used to selectively remove this material. A representative removal process includes a spacer etch, or other etch process that selectively removes horizontally-oriented materials.

Figure 2D:
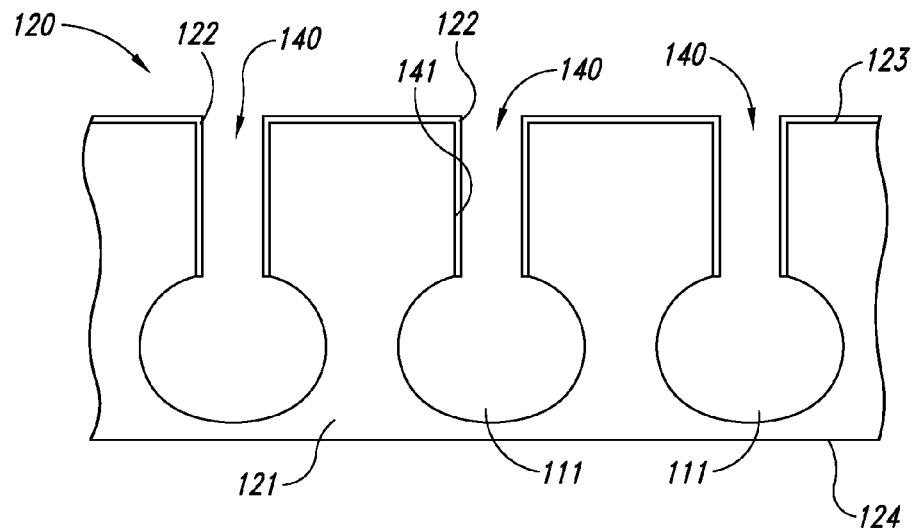

In FIG. 2D, terminal openings 111 have been formed at the ends of individual vias 140. In general, the terminal openings 111 are formed without affecting the shapes of the vias 140 above, due to the protective function performed by the protective layer 122 that covers the sidewall surfaces 141. The terminal openings 111 can have shapes different than those of the via 140. For example, while the vias 140 may have a generally cylindrical shape, the terminal openings 111 can have a generally spherical shape. The terminal openings 111 can also extend laterally beyond the width of the via 140, for example, by using an isotropic removal process as opposed to an anisotropic removal process. Further representative techniques for forming such structures are included in an article titled "Micromachining of Buried Micro Channels in Silicon" (de Boer, et al., Journal of Micro Electromechanical Systems, Vol. 9, No. 1, March 2000), incorporated herein by reference. After the terminal openings 111 are formed, the portions of the protective layer 122 extending into and between the vias 140 are removed prior to subsequent steps for applying conductive material in both the via 140 and the terminal opening 111, as described below.

Figure 2E:
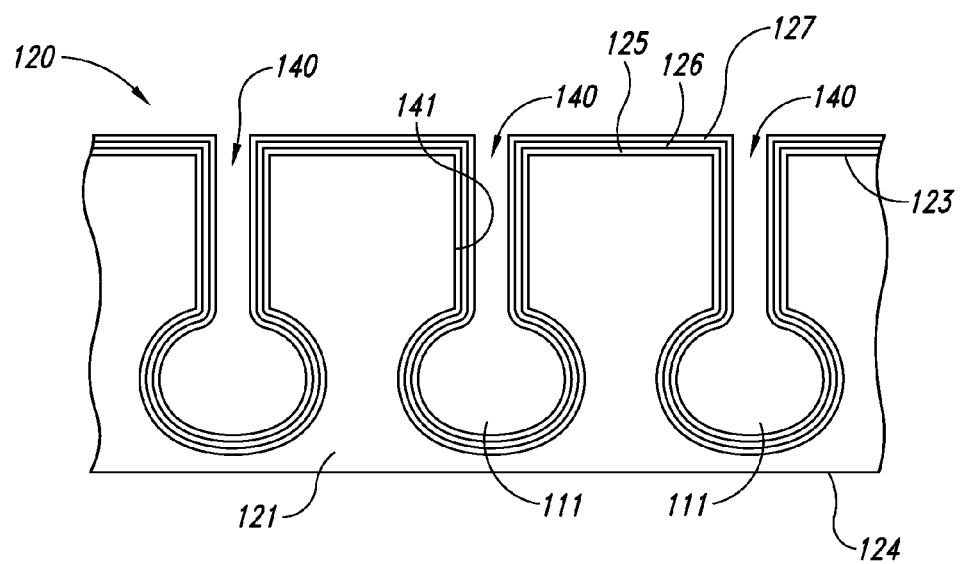

FIG. 2E illustrates the semiconductor substrate 120 after additional materials have been disposed thereon. For example, as shown in FIG. 2E, a dielectric layer 125 has been disposed on the first surface 123 of the substrate material 121, as well as in the vias 140 and the terminal openings 111. A barrier layer 126 has been disposed on the dielectric layer 125, and an optional seed layer 127 has been disposed on the barrier layer 126. Suitable dielectric materials include TEOS, parylene, nitrides, oxides and/or other suitable materials. Suitable barrier layer materials include tungsten, titanium nitride, tantalum, compounds of the foregoing materials and/or other suitable materials. In some embodiments, the seed layer 127 is used to facilitate the process of filling the vias 140 and the terminal openings 111. In other embodiments, a direct on barrier plating process can be used to achieve the same result.

Figure 2F:
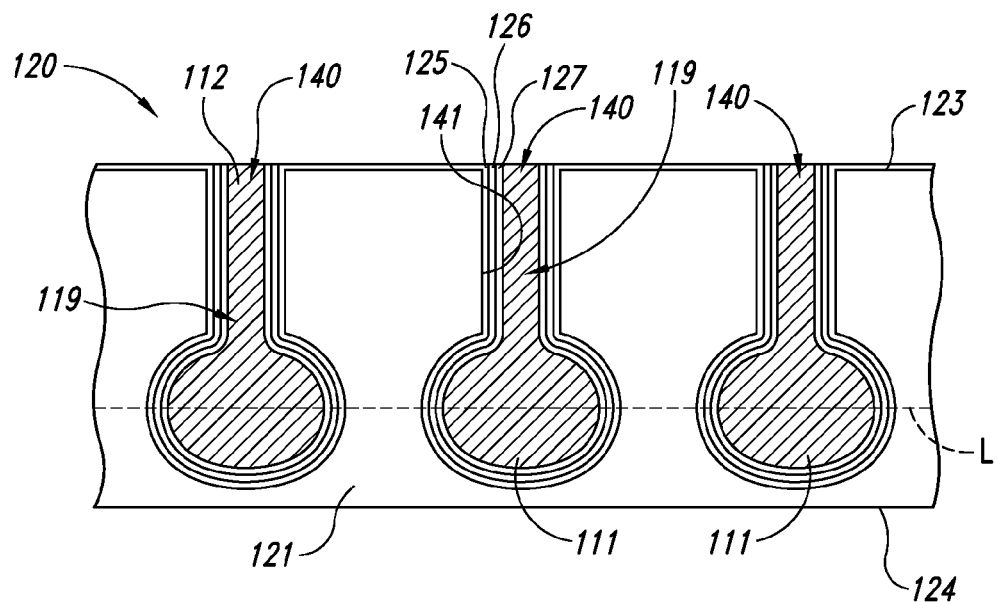

FIG. 2F illustrates the semiconductor substrate 120 after a conductive material 112 has been disposed in the vias 140 and the terminal openings 111. The conductive material 112 can be disposed in both the vias 140 and the terminal openings 111 using a bottom-up deposition process or other suitable process to form a unitary conductive structure 119 that fills both the vias 140 and the terminal openings 111. This single-step process can be performed without realigning the semiconductor substrate 120 between the operation of forming the conductive material 112 in the via 140 and the operation of forming the conductive material 112 in the terminal opening 111. This operation can also be performed without the need to form a vent hole at the end of the via 140, which further reduces processing time.

Suitable techniques for introducing the conductive material 112 into the via 140 and terminal opening 111 include but are not limited to pulsed chemical vapor deposition (pCVD), ionic physical vapor deposition (iPVD), atomic layer deposition (ALD), electro-grafting, bottom-up ECD plating, and electroless plating. Suitable conductive materials include copper, aluminum, tungsten, gold and/or alloys of the foregoing constituents. In particular embodiments, the conductive material 112 is selected to be electrolytic copper, which has enhanced purity when compared to electrolessly disposed materials, and when compared to solder. For example, the conductive material can be at least 90% copper and in some cases, 99% copper.

In still further particular embodiments, the conductive material 112 is solder free, e.g., it includes no solder or no more than a trace amount of solder. It is expected that such a material selection can produce conductive structures with enhanced conductivity and/or structural characteristics.

In still further embodiments, the conductive material 112 can be preformed (at least in part) before being disposed in the via 140 and the terminal opening 111. For example, the conductive material 112 can include a pre-formed wire that is inserted into the via 140 using a wire-bonding process. In this case, the process described below for removing material from the second surface 124 of the substrate 120 can be performed before rather than after the conductive material 112 is disposed in the via 140.

When the conductive material 112 has been introduced into the via 140 and the terminal opening 111 using a build-up technique (e.g., plating), the process can next include removing material from the second surface 124 to expose the conductive material 112 in the terminal opening 111. For example, in a particular embodiment, the substrate material 121 can be removed (e.g., in a backgrinding or other removal process) up to the dashed line L shown in FIG. 2F.

Figure 2G:
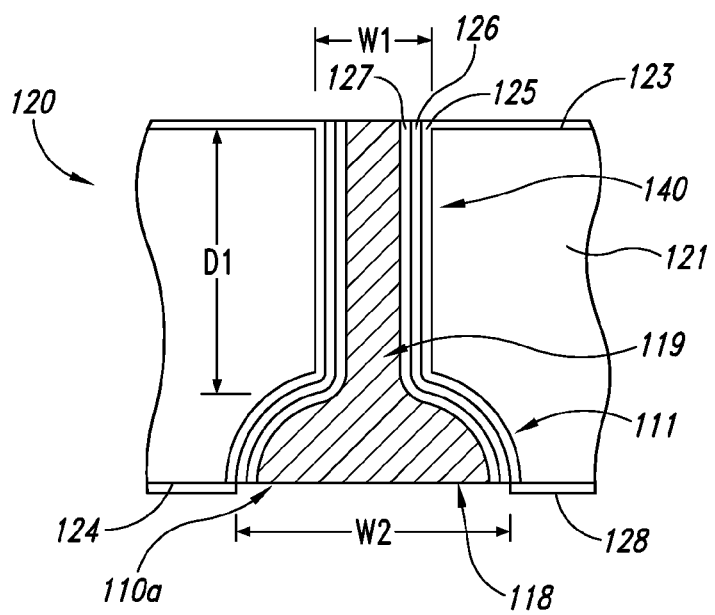

FIG. 2G illustrates a portion of the substrate 120 shown in FIG. 2F, including a single via 140 after the substrate material 121 has been removed from the second surface 124. As shown in FIG. 2G, removing the substrate material 121 can expose the conductive material 112 to form a first terminal 110a. The resulting first terminal 110a can have a width W2 that is greater than a corresponding width W1 of the via 140. Accordingly, the first terminal 110a can include additional exposed surface area for connecting to adjacent structures. A passivation layer 128 can then be disposed on the second surface 124 to protect the second surface 124 after the foregoing backgrinding operation.

The dimensions of the via 140 and the first terminal 110a can be selected depending upon characteristics of the substrate 120 to form highly conductive, compact electrical paths. For example, for an initially 800µ-thick substrate 120, the via 140 can be selected to have a depth D1 of less than 100µ (e.g., 50µ or 25µ). The remaining substrate material 121 can be background, as described above. The width W1 can be 20µ or less (e.g., 10µ or 5µ).

Figure 2H:
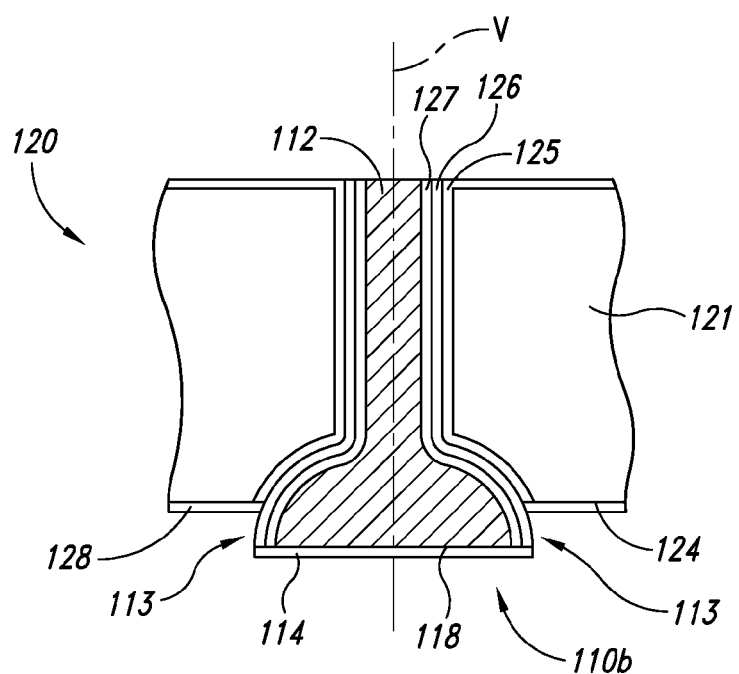

In a particular aspect of an embodiment shown in FIG. 2G, the first terminal 110a can have an exposed conductive surface 118 that is generally flush with the second surface 124 of the substrate material 121. Accordingly, the resulting conductive structure 119 in the via 140 and the terminal opening 111 extends through the substrate material 121 from the first surface 123 to the second surface 124. In other embodiments, additional substrate material 121 can be removed so as further expose the surfaces of the first terminal 110a, e.g., to form a "bump." For example, FIG. 2H illustrates a second terminal 110b that is formed by removing additional material from the second surface 124 of the substrate 120 in the regions surrounding the second terminal 110b. The substrate material 121 can be removed using a wet etch process, or a plasma dry etch process (e.g., with an $SF_6O_2$ chemistry). The dielectric material 125 in this region can also be removed. This process can produce electrically conductive, outwardly facing surfaces 113 that face laterally outwardly from the via axis V, and project axially away from the second surface 124 in a tapered fashion. Accordingly, the outwardly facing surfaces 113 can increase the exposed surface area of the second terminal 110b (relative to the cross-sectional area of the second terminal 110b) available for establishing connections with adjacent devices. In other embodiments, the outwardly facing surfaces 113 can project or otherwise extend axially into or against the structures of adjacent devices to establish electrical and physical connections.

The second terminal 110b can include conductive materials in addition to the conductive material 112 that fills the via 140. For example, the second terminal 110b can include a flash coating 114 that is applied to the exposed surface 118. The flash coating 114 can facilitate electrical connections with adjacent devices. In a particular embodiment, the flash coating can include tin, gold, indium or other suitable electrically conductive materials. In general, the flash coating 114 can be applied using an electroless processing which does not require the use of a mask.

Figure 2I:
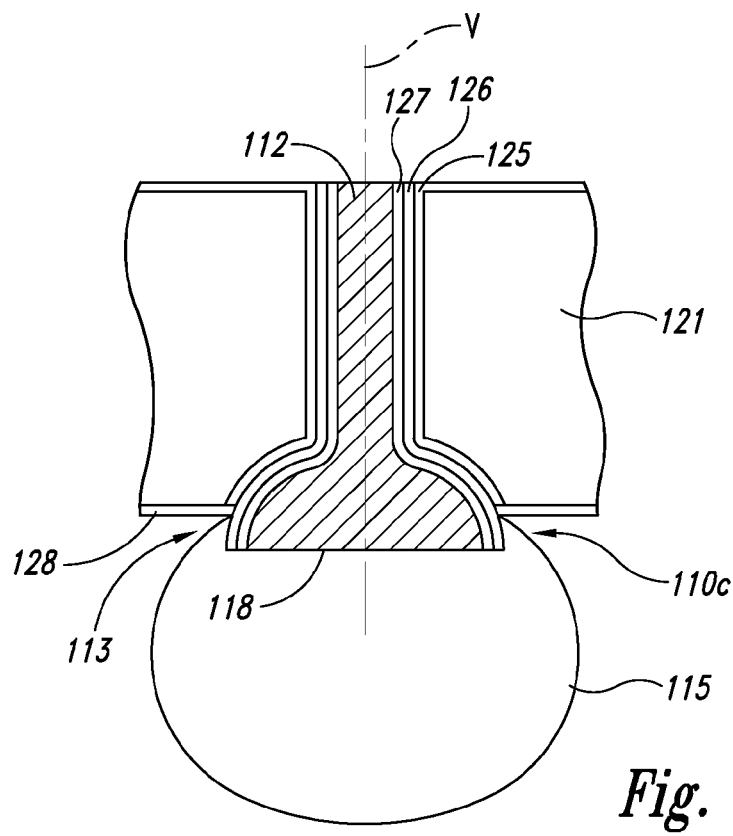

FIG. 2I illustrates a representative third terminal 110c that also includes conductive materials in addition to the conductive fill material 112. In this particular embodiment, the additional material can include a solder ball 115. The solder ball 115 can contact the downwardly facing exposed surface 118 of the conductive material 112, as well as the outwardly facing surfaces 113. This arrangement can give the terminal 110c increased surface area for connecting to adjacent structures. Because the solder ball 115 extends around the outwardly facing surfaces 113, it can provide both increased physical and electrical continuity with the conductive material 112.

Figure 2J:
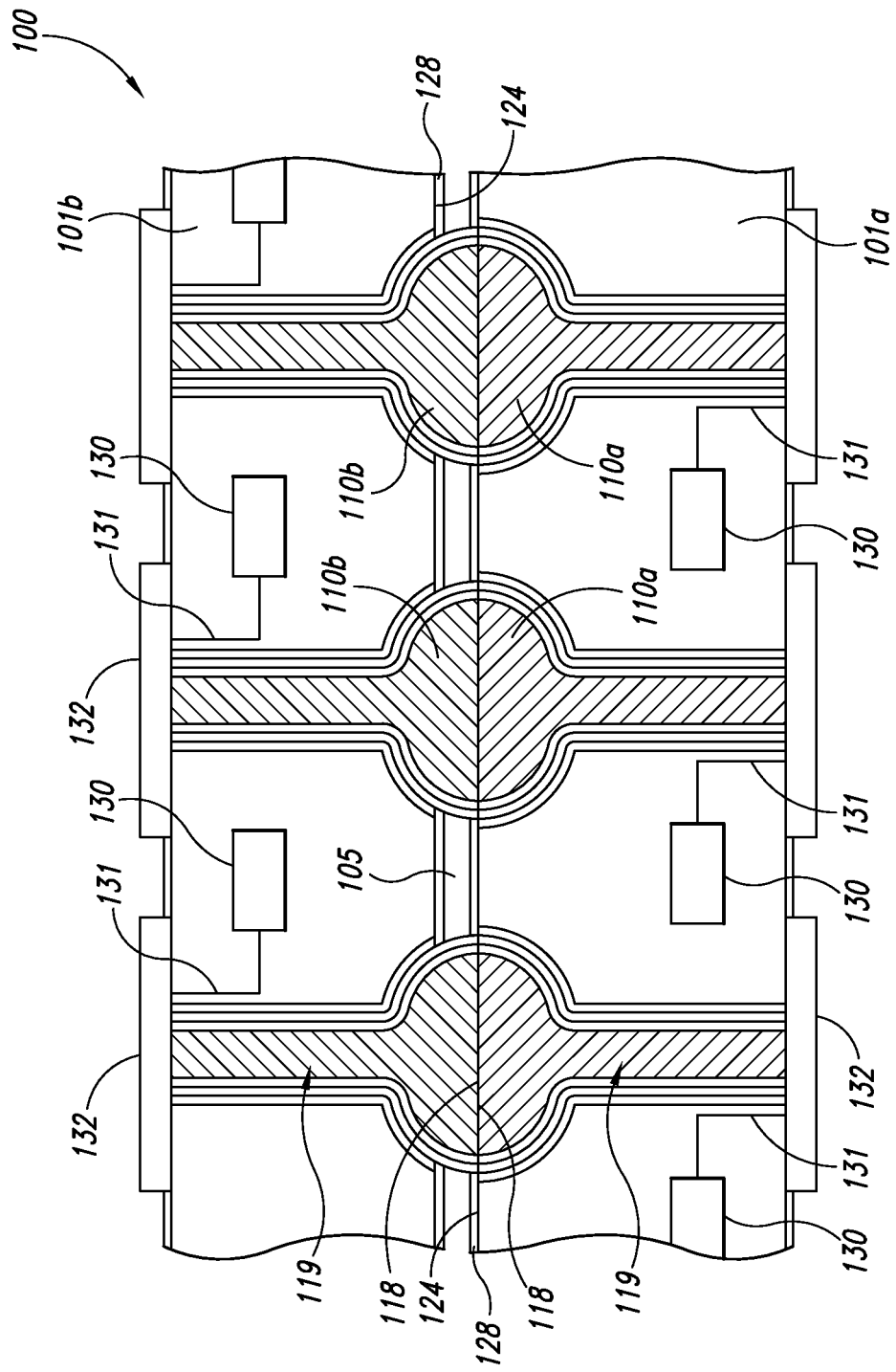
FIG. 2J is a partially schematic, side cross-sectional view of two semiconductor substrates stacked in accordance with a particular embodiment of the disclosure.

FIG. 2J schematically illustrates a portion of a semiconductor assembly 100 that includes a first die 101a electrically connected to a second die 101b in a stacked arrangement. The dies 101a, 101b can include buried microelectronic elements 130 (e.g., capacitors or transistors) connected to bond pads 132 with lines 131. The bond pads 132 are in turn electrically connected to the conductive structures 119 in the vias 140. The first die 101a can include first terminals 110a generally similar in configuration to those described above with reference to FIG. 2G. The second die 101b can include second terminals 110b generally similar in configuration to those described above with reference to FIG. 2H. The two dies 101a, 101b can be brought together with the first terminals 110a contacting the second terminals 110b. In one embodiment, the exposed surfaces 118 of individual first terminals 110a can contact the exposed surfaces 118 of corresponding individual second terminals 110b. In another embodiment, one or both of the first and second terminals 110a, 110b can include a flash coating 114 (FIG. 2H) that contacts the other terminal. The terminals 110a, 110b can be connected using heat, pressure, and/or other forms of energy (e.g., ultrasonic energy) to fuse corresponding first and second terminals 110a, 110b to each other. For example, the terminals 110a, 110b can be attached without reflowing the terminal constituents (e.g., by applying pressure, or pressure in combination with ultrasonic energy). Suitable representative processes include ultrasonic, thermal-sonic and/or thermal-compression processes. In one embodiment, the second terminals 110b can project axially beyond the corresponding second surface 124 of the second die 101b to engage with the corresponding first terminals 110a of the first die 101a. In some cases, a gap 105 may remain between the dies 101a, 101b in the interstices among the terminals 110a, 110b after the attachment process is complete. The gap 105 can be filled with an underfill material or other suitable material, e.g., prior to encapsulating the stacked structure. In particular embodiments, the completed assembly can have a configuration generally similar to that shown in FIG. 1.

In FIG. 2J, the first and second dies 101a, 101b are stacked so that the exposed surfaces 118 of the first terminals 110a contact the exposed terminals 118 of the second terminals 110b. In other embodiments, the relative orientations of one or both dies 101a, 101b can be inverted. For example, in one embodiment, both dies 101a, 101b can be inverted (compared to the orientation shown in FIG. 3J) so that the bond pads 132 of the first die 101a contact corresponding bond pads 132 of the second die 101b, and the exposed surfaces 118 of each die 101a, 101b face outwardly (e.g., upwardly and downwardly in FIG. 2J).

Figure 2K:
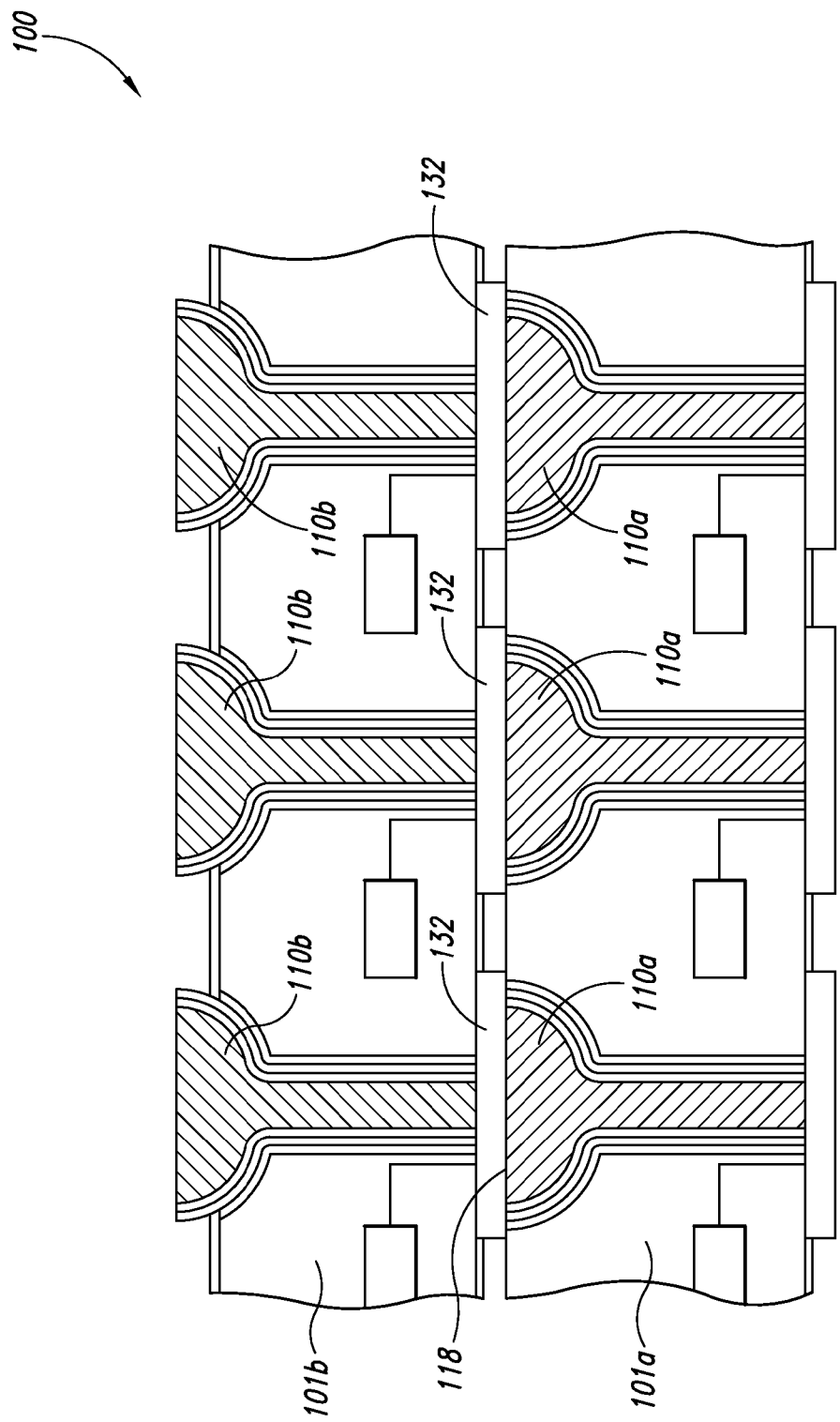
FIG. 2K is a partially schematic, side cross-sectional view of two semiconductor substrates stacked in accordance with another embodiment of the disclosure.

In another example, shown in FIG. 2K, the orientation of the second die 101b is inverted relative to the orientation shown in FIG. 2J, while the first die 101a retains its orientation. Accordingly, the exposed surfaces 118 of the first die 101a contact the bond pads 132 of the second die 101b. This orientation can be used to stack more than two dies in particular embodiments. In other embodiments, the foregoing orientations described above with reference to FIGS. 2J-2K can be combined, e.g., when the assembly includes more than two stacked dies. For example, a third die can be stacked on top of the second die 101b shown in FIG. 2J, with exposed surfaces of the third die terminals in contact with the bond pads 132 of the second die 101b.

One feature of at least some of the foregoing embodiments described above with reference to FIGS. 1-2K is that the conductive path through the via 140 can be formed concurrently with forming the terminal 110 at the end of the via 140. As a result, the overall conductive structure 119 within the via 140 and at the terminal 110 can be generally unitary and homogeneous. In particular, the same conductive material can fill the via 140 and the terminal opening 111, without forming a material boundary within the overall structure 119. This process can accordingly produce an overall conductive structure 119 having an increased continuity when compared with existing structures that have boundaries between vias and corresponding bond pads. As a result, these structures can have increased reliability when compared to existing structures.

In addition, the via 140 and the terminal 110 can be formed without the need for using a mask/lithography process at the second surface 124, which is typically used to form a bond pad or bump at the end of a via. Instead, the structure can be formed using less time-consuming and less expensive deposition and selective etch processes. This in turn can reduce the amount of time needed to form the conductive structure 119 and therefore the cost of the die or other product in which the via is formed.

Another feature of at least some embodiments of the foregoing processes is that the semiconductor substrates 120 need not be realigned between the operation of filling the via 140 and the operation of forming the terminal 110. Instead, as discussed above, both structures can be formed as part of the same operation. Still further, as discussed above, the via 140 can be formed using processes that produce non-scalloped, generally uniform, flat, cylindrical walls. For example, a continuous, anisotropic etch process can be used to produce the via 140. As a result, the via 140 can be less time consuming to form than vias that use alternating etch processes, and can use the limited volume available in the substrate 120 more efficiently than processes that produce contoured and/or non-uniform walls.

Figure 3A:
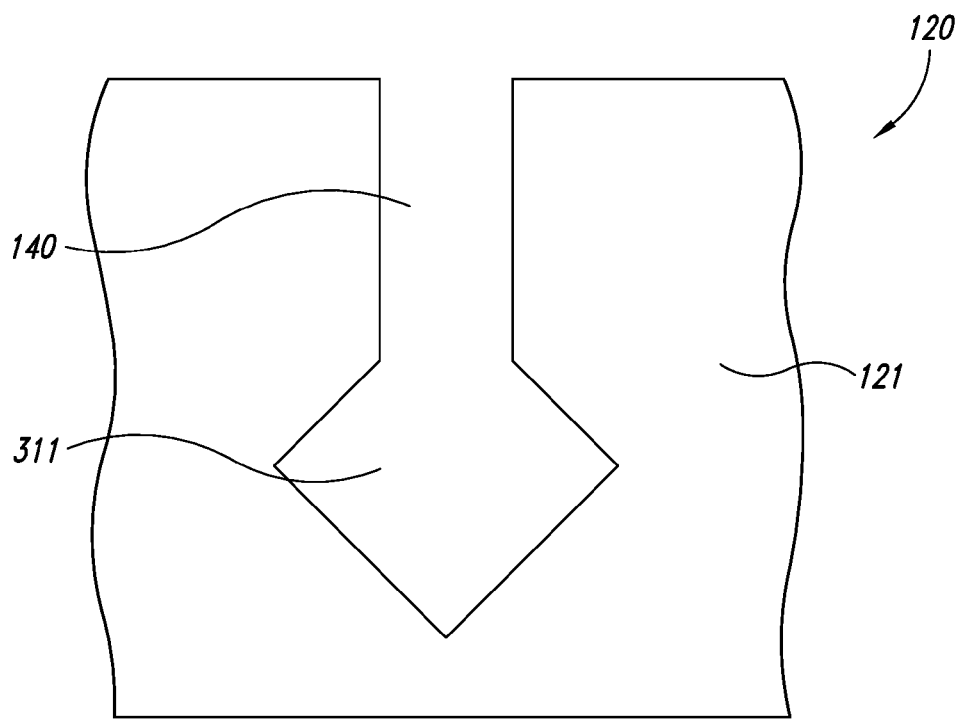
FIGS. 3A-3F are partially schematic, side cross-sectional illustrations of representative methods for forming substrate terminals having shapes in accordance with further embodiments of the invention.

FIGS. 3A-3F illustrate representative processes for forming conductive terminals having shapes in accordance with further embodiments of the disclosure. Referring first to FIG. 3A, a via 140 is formed in a substrate 120 using processes generally similar to those described above. A terminal opening 311 can then be formed at the bottom of the via 140, using processes that may form shapes other than the generally spherical shape described above. For example, an anisotropic etch process can be used to remove substrate material 121 in a manner that is aligned with crystal planes of the substrate material 121, producing a terminal opening 311 having generally flat sidewalls. Representative processes for forming such openings are discussed in de Boer et al. (March 2000), previously incorporated by reference.

Figure 3B:
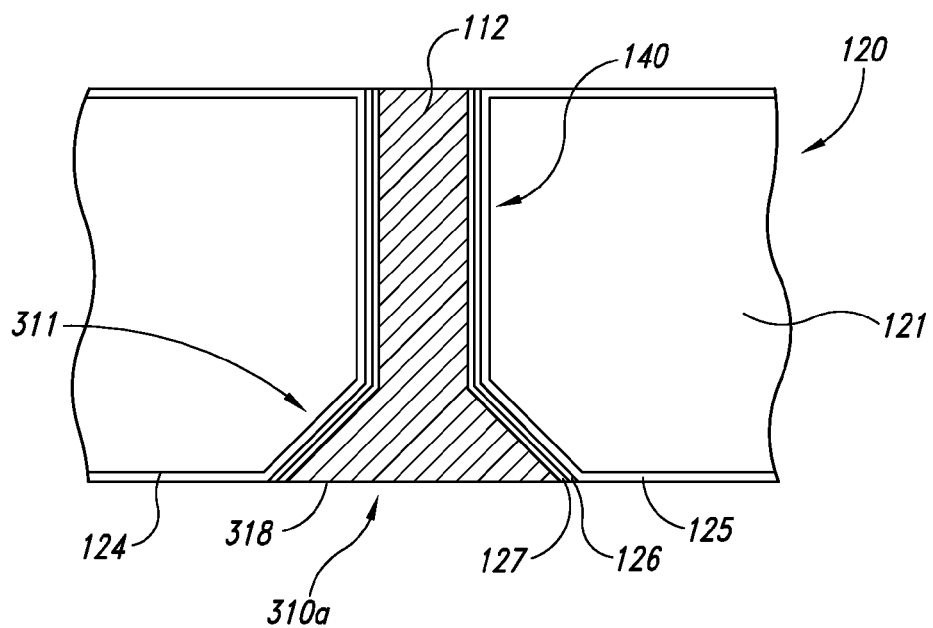

In FIG. 3B, a dielectric layer 125, a barrier layer 126, and an optional seed layer 127 have been disposed in the via 140 and the terminal opening 311. The via 140 and the terminal opening 311 have then been filled with a conductive material 112 using any of the foregoing processes described above with reference to FIG. 2F. Material from the second surface 124 of the substrate 120 is then removed to form a first terminal 310a having an exposed surface 318.

Figure 3C:
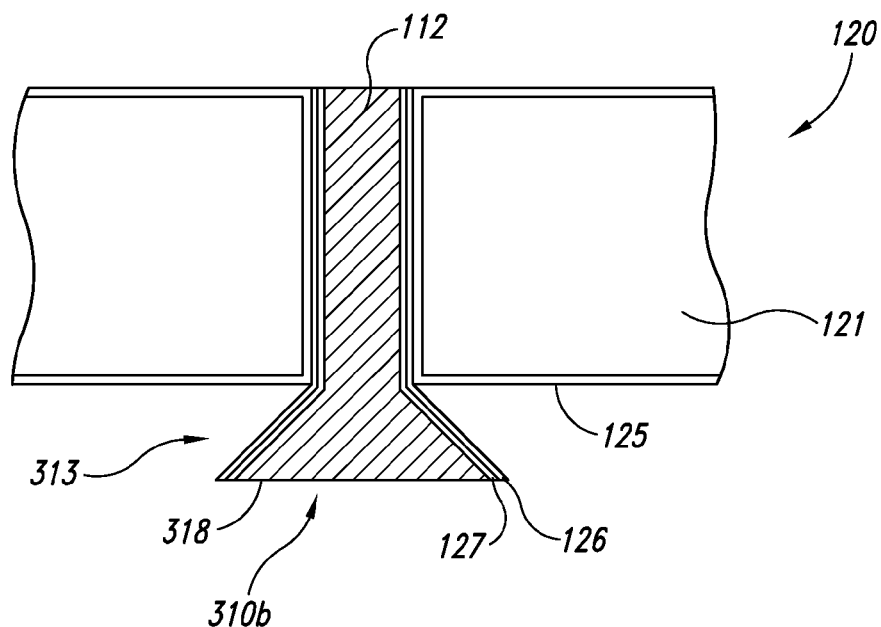

FIG. 3C illustrates a second terminal 310b formed by removing additional substrate material 121 in a manner generally similar to that described above with reference to FIG. 2H. Accordingly, the second terminal 310b can include outwardly facing surfaces 313 that project beyond the second surface 124. The second terminal 310b can include an additional conductive material, for example, a flash coating (as discussed above with reference to FIG. 2H) or a solder ball (as discussed above with reference to FIG. 2I).

Figure 3D:
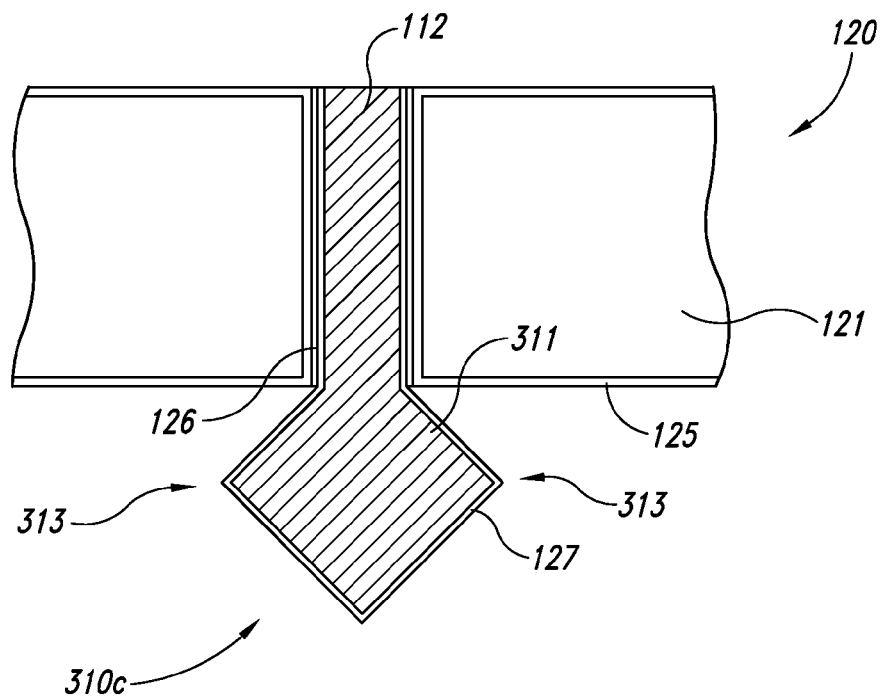

FIG. 3D illustrates a third terminal 310c configured in accordance with another embodiment of the disclosure. In this embodiment, the backgrinding process has been halted prior to removing any of the conductive material 112 within the terminal opening 311. The substrate material 121 has been selectively removed from around the conductive material 112 in the terminal opening 311 to form the illustrated structure. For example, the substrate 120 can be exposed to an etchant that preferentially removes the substrate material 121 (and possibly the dielectric material 125 and the barrier layer 126) while not removing the conductive material 112 and optionally the seed layer 127. This arrangement can produce a third terminal 310c that projects beyond the second surface 124 by an additional amount and provides an additional volume of conductive material 112 at the third terminal 310c for connecting the substrate 120 to adjacent structures.

Figure 3E:
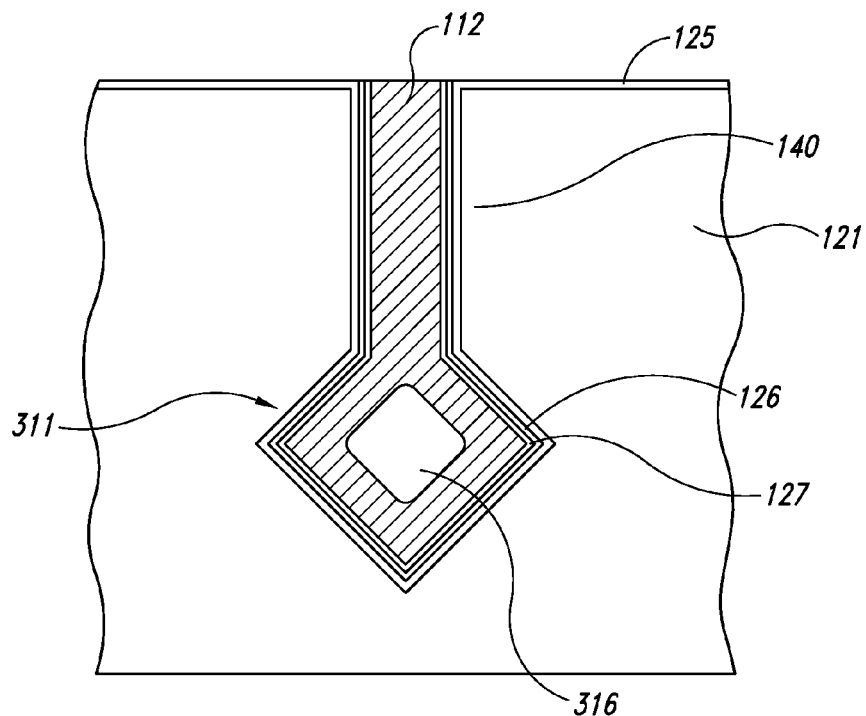
Figure 3F:
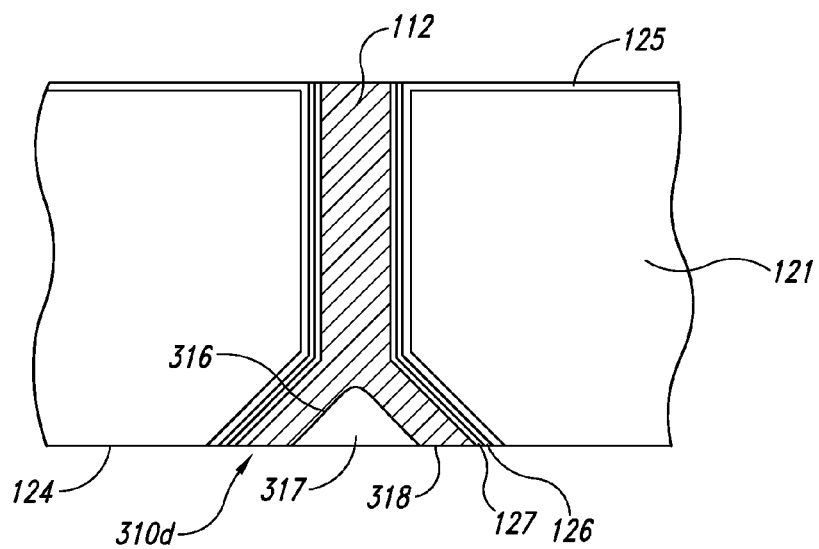

FIGS. 3E and 3F illustrate another process for forming a terminal in accordance with another embodiment of the disclosure. As shown in FIG. 3E, in some cases, the conductive material 112 applied to the surfaces of the terminal opening 311 and the via 140 may leave a void 316, e.g., in the terminal opening 311. While voids are generally undesirable in most semiconductor processing operations, the void 316 shown in FIG. 3E may be readily accommodated and/or accounted for. For example, as shown in FIG. 3F, when the substrate material 121 is removed from the second surface 124 to uncover the exposed surface 318, the void 316 is also exposed. Optionally, the void 316 can then be filled with a second conductive material 317. For example, the void 316 can be filled or partially filled with a flash coating, and the shape and additional surface area of the void 316 can facilitate a strong physical and electrical connection with the coating. In another embodiment, the void 316 can be left intact and can be used to receive conductive material from a corresponding terminal structure of a neighboring (e.g., stacked) substrate. For example, the void 316 can receive and connect with a solder ball or other terminal (e.g., the second terminal 110b or the third terminal 110c shown in FIGS. 2H, 2I respectively) from a neighboring substrate.

Figure 4:
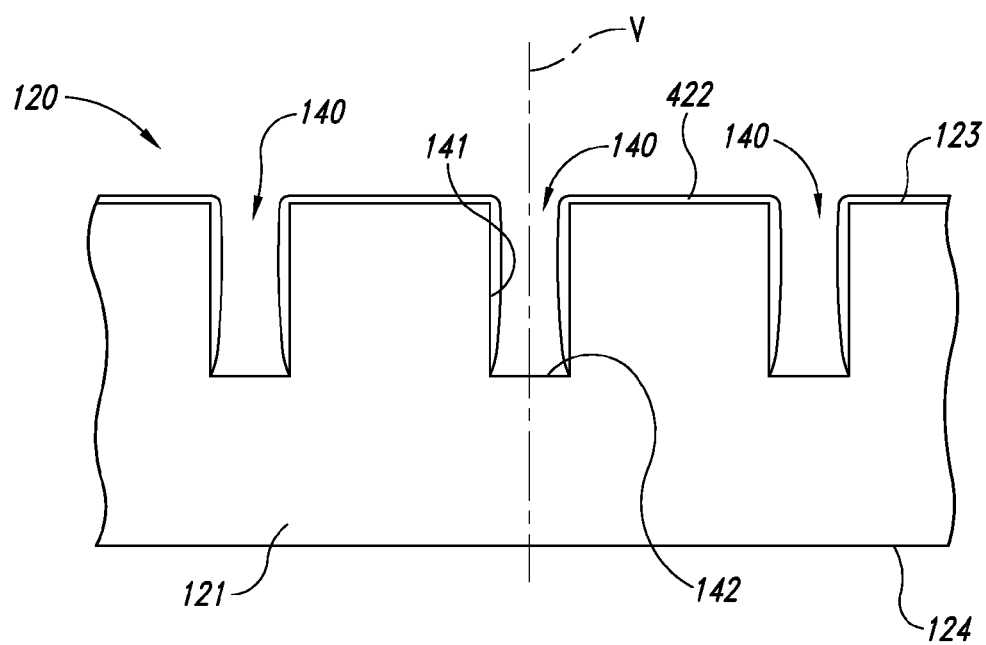
FIG. 4 is a partially schematic, side cross-sectional illustration of a process for disposing a protective layer on a semiconductor substrate in accordance with a particular embodiment of the disclosure.

FIG. 4 illustrates another embodiment for forming the vias 140 in the substrate 120. In this embodiment, a protective layer 422 is applied to the first surface 123 of the substrate 120, and to the sidewall surfaces 141 of the vias 140. In some cases, the via 140 may have a high aspect ratio (e.g., a relatively long length and/or relatively small width), which can cause the protective layer 422 to more readily attach to the sidewall surfaces 141 than to the end surface 142. As a result, the end surface 142 may receive little or no protective material 422. This arrangement can eliminate the need to remove the protective layer 422 from the end surface 142 and instead, a terminal opening can be formed directly after applying the protective layer 422. As a result, embodiments of this process are expected to reduce the amount of time required to form the conductive terminals, and can thereby reduce the cost of forming the dies or other end products from the substrate 120.

Figure 5:
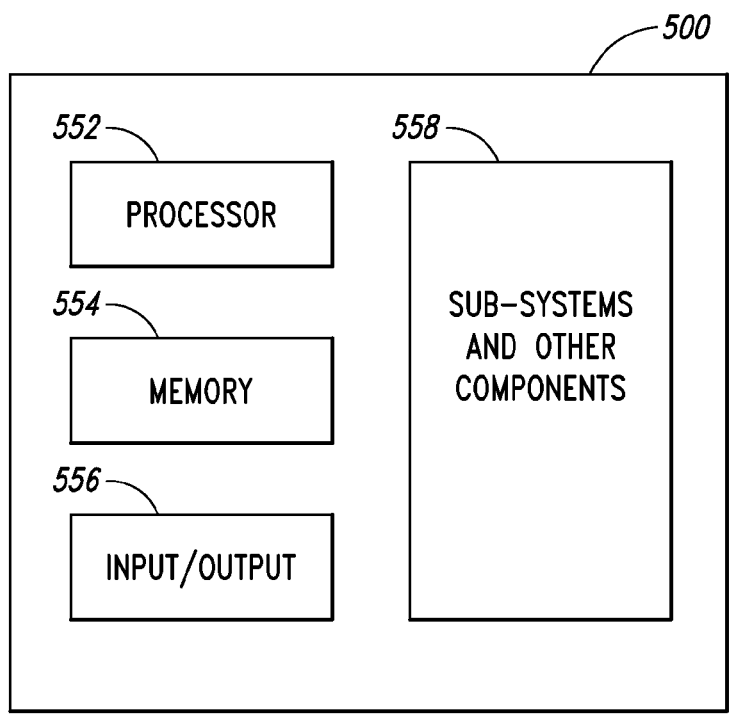
FIG. 5 is a schematic illustration of a system that can include one or more packages configured in accordance with several embodiments of the disclosure.

Any of the semiconductor packages resulting from joining the substrates in accordance with the methods described above with reference to FIGS. 1-4 can be incorporated into a myriad of larger and/or more complex systems, a representative example of which is a system 500 shown schematically in FIG. 5. The system 500 can include a processor 552, a memory 554 (e.g., SRAM, DRAM, flash memory and/or other memory device), input/output devices 556 (e.g., a sensor and/or transmitter), and/or other subsystems or components 558. Semiconductor packages having any one or a combination of the features described above with reference to FIGS. 1-4 may be included in any of the devices shown in FIG. 5. The resulting system 500 can perform any of a wide variety of computing, processing, storage, sensing, imaging, and/or other functions. Accordingly, the representative system 500 can include without limitation, computers and/or other data processors, for example, desktop computers, laptop computers, Internet appliances, hand-held device (palm-top computers, wearable computers, cellular or mobile phones, personal digital systems, music players, cameras, etc.), multi-processor systems, processor-based or programmable consumer electronics, network computers and mini-computers. Other representative systems 500 may be housed in a single unit or distributed over multiple interconnected units (e.g., through a communication network). The components of the system 500 can accordingly include local and/or remote storage devices, and any of a wide variety of computer-readable media.

From the foregoing, it will be appreciated that specific embodiments of the disclosure have been described for purposes of illustration, but that the foregoing systems and methods may have other embodiments as well. For example, while certain of the embodiments described above were described in the context of semiconductor packages having two or three stacked dies, in other embodiments, the packages can include other numbers of stacked dies. In some cases, the via 140 may not extend completely through the substrate, e.g., if the substrate forms the topmost die shown in FIG. 1. In such cases, the via 140 may still be used for thermal purposes, e.g., to act as a heat conduit or heat sink. The same processes described above can be used to form the via and terminal, but the terminal is not exposed at the second surface of the substrate. Such substrates can also be used for planar (unstacked) dies. In other embodiments, the terminal can be exposed to connect the planar (unstacked) die to PCBs or other support members or substrates. Many of the processes for forming the foregoing connected structures and connecting the mating structures of different semiconductor substrates can be carried out at the die level (e.g., after singulating the dies), the wafer level (e.g., before singulating the dies) and/or other processing stages.

Certain features described in the context of particular embodiments may be combined or eliminated in other embodiments. For example, the process of coating the sidewall surfaces described above with reference to FIG. 4 can be applied to vias formed in association with the conductive structures shown in any of the other Figures. The process of removing substrate material from around the entire terminal opening, as shown in FIGS. 3C and 3D, can be applied to the terminal openings shown in FIG. 2E or 2H. Further, while features and results associated with certain embodiments have been described in the context of those embodiments, other embodiments may also exhibit such features and results, and not all embodiments need necessarily exhibit such features and results. Accordingly, the disclosure can include other embodiments not expressly shown or described above.

We claim:

1. A semiconductor assembly, comprising:
   a semiconductor substrate including a substrate material having a first major surface, a second major surface, and an opening extending from the first major surface to the second major surface, the opening including a generally cylindrical portion extending generally normal to the first major surface and a terminal portion extending transverse to the cylindrical portion and intersecting the second major surface, the terminal portion having a width generally parallel to the plane of the first major surface that is greater than a corresponding width of the cylindrical portion;
   a homogeneous volume of conductive material disposed in both the cylindrical portion and the terminal portion of the opening, the conductive material forming a conductive path in the cylindrical portion and at least a portion of a conductive terminal in the terminal portion, wherein the conductive terminal has a cross-section with generally flat walls, the cross-section being taken in a plane normal to the second major surface, wherein the conductive terminal projects outwardly away from the second major surface and includes an exposed outwardly facing surface configured for connection to an adjacent structure, and
   wherein the conductive terminal has a first cross-sectional width in a first plane that generally corresponds to the second major surface of the semiconductor substrate, and a second cross-sectional width in a second plane that is generally parallel to the first plane and positioned beyond an outermost surface of the semiconductor substrate, wherein the second cross-sectional width is at the exposed outwardly facing surface and is greater than the first cross-sectional width;
   a seed layer at an outer boundary of the conductive material at the terminal portion; and
   a barrier layer at an outer boundary of the seed layer at the terminal portion, wherein the seed layer and the barrier layer project outward beyond the outermost surface of the semiconductor substrate and extend to the second cross-sectional width of the exposed outwardly facing surface, and wherein the conductive terminal comprises the seed layer, the barrier layer, and the conductive material.

2. The semiconductor assembly of claim 1, further comprising a microelectronic element in the substrate material and electrically coupled to the conductive material.

3. The semiconductor assembly of claim 1 wherein the conductive material is a solderless material.

4. The semiconductor assembly of claim 3 wherein:
   an outer boundary of the conductive terminal tapers laterally outwardly in a direction away from the second major surface; and the assembly further comprises a solder ball attached to the conductive material at the terminal portion, the solder ball being at least partially aligned along the tapered outer boundary of the conductive terminal.

5. The semiconductor assembly of claim 1 wherein the generally flat walls of the conductive terminal are aligned with crystal planes of the semiconductor substrate material.

6. The semiconductor assembly of claim 1 wherein the conductive material comprises at least 90% copper.

7. The semiconductor assembly of claim 1 wherein the semiconductor substrate is a first semiconductor substrate and the conductive terminal is a first conductive terminal, the semiconductor assembly further comprising:
   a second semiconductor substrate including a substrate material having a first major surface, a second major surface, and an opening extending from the first major surface to the second major surface, the opening including a generally cylindrical portion extending generally normal to the first major surface, the cylindrical portion having a generally smooth, uniform surface, the opening further including a terminal portion extending transverse to the cylindrical portion and intersecting the second major surface, the terminal portion having a width generally parallel to the plane of the first major surface that is greater than a corresponding width of the cylindrical portion;
   a homogeneous volume of conductive material disposed in both the cylindrical portion and the terminal portion of the opening of the second semiconductor substrate, the conductive material forming a conductive path in the cylindrical portion and at least a portion of a second conductive terminal in the terminal portion; and
   a bond pad having a first area facing the first semiconductor substrate and a second area facing the second semiconductor substrate,
   wherein the first conductive terminal contacts the first area of the first bond pad and the second conductive terminal contacts the second area of the bond pad.

8. The semiconductor assembly of claim 7, further comprising:
   a first microelectronic element in the first semiconductor substrate and electrically coupled to the first conductive terminal; and
   a second microelectronic element in the second semiconductor substrate and electrically coupled to the second conductive terminal.

\* \* \* \* \*